United States Patent
Yun et al.

(10) Patent No.: US 12,202,961 B2
(45) Date of Patent: Jan. 21, 2025

(54) RESIN COMPOSITION AND DISPLAY DEVICE INCLUDING THE SAME

(71) Applicants: Samsung Display Co., Ltd., Yongin-Si (KR); SEOUL NATIONAL UNIVERSITY R&DB FOUNDATION, Seoul (KR)

(72) Inventors: Sanghyun Yun, Sejong-si (KR); Jae Pil Kim, Hanam-si (KR); Tae Gyu Hwang, Ulsan (KR); Su Hyeon Kim, Suwon-si (KR); Hoon Kang, Yongin-si (KR); Youngjun Kim, Hwaseong-si (KR); Hyunyoung Jung, Hwaseong-si (KR)

(73) Assignees: Samsung Display Co., Ltd., Yongin-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 554 days.

(21) Appl. No.: 17/535,645

(22) Filed: Nov. 25, 2021

(65) Prior Publication Data
US 2022/0282082 A1 Sep. 8, 2022

(30) Foreign Application Priority Data
Mar. 3, 2021 (KR) ........................ 10-2021-0027914

(51) Int. Cl.
*C08L 33/24* (2006.01)
*C08K 5/3475* (2006.01)
(Continued)

(52) U.S. Cl.
CPC ............ *C08L 33/24* (2013.01); *C08K 5/3475* (2013.01); *H10K 50/865* (2023.02); *H10K 59/122* (2023.02)

(58) Field of Classification Search
CPC ....... C08F 2/50; C08K 5/0041; C08K 5/3415; C08K 5/3475; C08L 33/24; C08L 79/08;
(Continued)

(56) References Cited

U.S. PATENT DOCUMENTS

| | | | |
|---|---|---|---|
| 6,515,051 B2 | 2/2003 | Ravichandran et al. | |
| 6,649,770 B1 * | 11/2003 | Pastor | C07D 409/14 548/260 |
| 2004/0259031 A1 * | 12/2004 | Watanabe | G11B 7/254 |

FOREIGN PATENT DOCUMENTS

| | | |
|---|---|---|
| CN | 1850809 A | 10/2006 |
| JP | 3719023 A | 6/2000 |

(Continued)

*Primary Examiner* — Eli D. Strah
(74) *Attorney, Agent, or Firm* — Innovation Counsel LLP

(57) ABSTRACT

A resin composition includes a polyimide, an ultraviolet (UV) absorber represented by the following Chemical Formula 1 and a remaining N-methyl-2-pyrrolidone, and
(Continued)

[Chemical Formula 1]

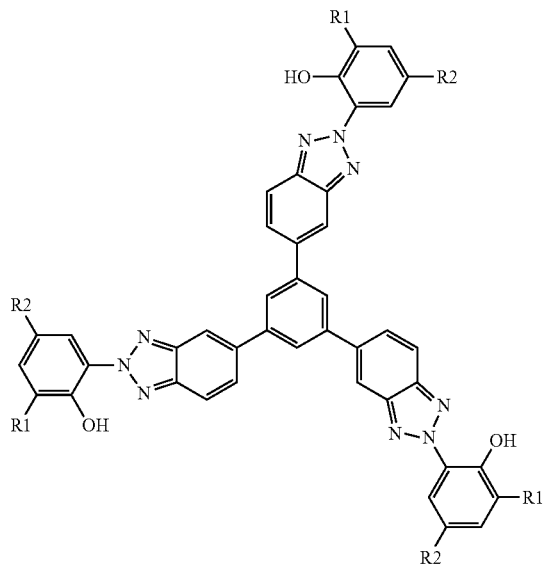

wherein, in Chemical Formula 1, R1 and R2 are each selected from a hydrogen group, a halogen group, an aliphatic substituent, and an aromatic group.

18 Claims, 5 Drawing Sheets

(51) Int. Cl.
    *H01L 27/32*     (2006.01)
    *H01L 51/52*     (2006.01)
    *H10K 50/86*     (2023.01)
    *H10K 59/122*     (2023.01)

(58) Field of Classification Search
    CPC .... C08L 2203/20; H01L 23/145; H01L 24/28; H10K 50/865; H10K 59/122; H10K 77/10
    See application file for complete search history.

(56) References Cited

FOREIGN PATENT DOCUMENTS

JP             4202115 A     7/2004
KR    10-2019-0066008 A     6/2019

\* cited by examiner

RESIN COMPOSITION AND DISPLAY DEVICE INCLUDING THE SAME

CROSS-REFERENCE TO RELATED APPLICATION(S)

This application claims priority under 35 USC § 119 to Korean Patent Application No. 10-2021-0027914 filed on Mar. 3, 2021, in the Korean Intellectual Property Office (KIPO), the entire disclosure of which is incorporated by reference herein.

BACKGROUND

1. Field

The present inventive concept relates to a resin composition and a display device including the resin composition. More particularly, the present inventive concept relates to the resin composition which absorbs ultraviolet rays and a display device including the resin composition.

2. Description of the Related Art

A flat panel display is being used as a display device to replace a cathode ray tube display due to characteristics such as light weight and thinness. Representative examples of such flat panel display devices include a liquid crystal display device and an organic light emitting display device.

When display devices are exposed to ultraviolet rays, materials included in the display devices may be discolored. Accordingly, transmittance of the display device may be reduced. In addition, ultraviolet rays may damage a bonding of a polymer materials included in the display device, so that the characteristic properties (e.g., transmittance) of the polymer materials may be lost.

SUMMARY

Embodiments provide resin composition which absorbs ultraviolet rays and a display device including the resin composition.

A resin composition according to an embodiment may include a polyimide, an ultraviolet (UV) absorber represented by the following Chemical Formula 1 and a remaining N-methyl-2-pyrrolidone. In Chemical Formula 1, R1 and R2 may be each a hydrogen group, a halogen group, an aliphatic substituent, and an aromatic group.

[Chemical Formula 1]

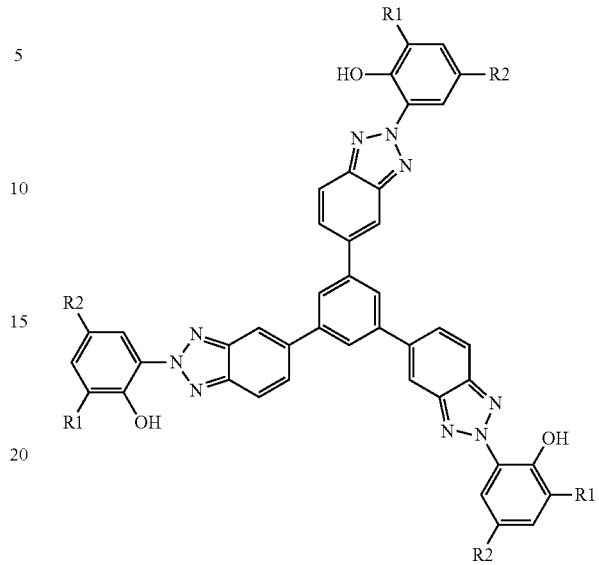

In an embodiment, the resin composition may include about 10 to about 30% by weight of the polyimide, about 0.03 to about 0.2% by weight of the UV absorber, and the remaining amount of N-methyl-2-pyrrolidone.

In an embodiment, the UV absorber may be formed by reacting a material represented by the following Chemical Formula 2 with a material represented by the following Chemical Formula 3.

[Chemical Formula 2]

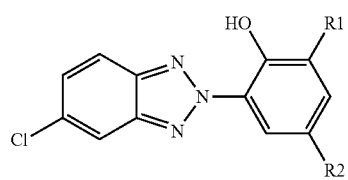

[Chemical Formula 3]

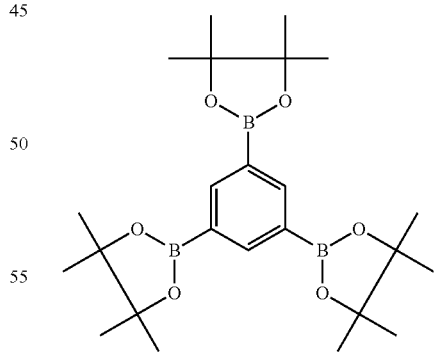

In an embodiment, the material represented by Chemical Formula 2 may be Tinuvin 327, and the R1 and R2 nay be each a tert-butyl group.

In an embodiment, the aliphatic substituent may be selected from an alkyl group and an ether-based substituent.

In an embodiment, the aromatic substituent may be selected from a phenyl group, a pyridinyl group, and a cumenyl group.

A display device according to an embodiment may include a transistor substrate including a base substrate and at least one transistor disposed on the base substrate and a light emitting element disposed on the transistor substrate and electrically connected to the transistor substrate. The base substrate may include a resin composition which includes a polyimide, an ultraviolet (UV) absorber represented by the following Chemical Formula 1 and a remaining N-methyl-2-pyrrolidone. In Chemical Formula 1, R1 and R2 may be each a hydrogen group, a halogen group, an aliphatic substituent, and an aromatic group.

[Chemical Formula 1]

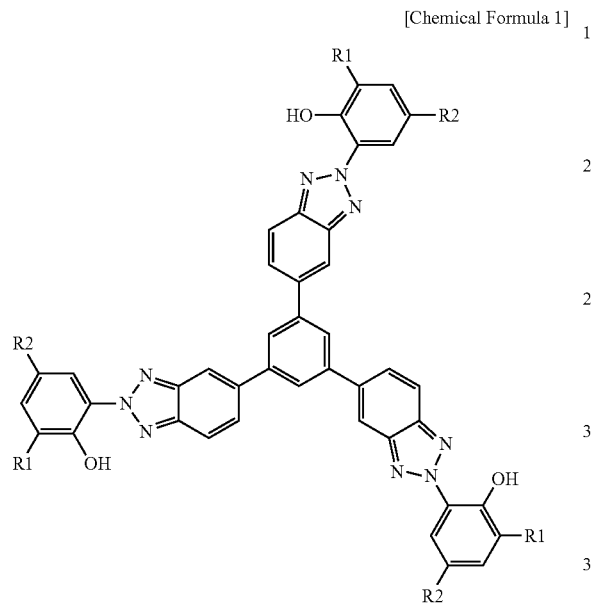

In an embodiment, the display device may further include a pixel defining layer disposed on the transistor substrate, having an opening exposing the transistor substrate and including the resin composition. The light emitting element may include a first electrode disposed in the opening, a light emitting layer disposed on the first electrode and a second electrode disposed on the light emitting layer.

In an embodiment, the transistor substrate may include at least one organic insulating layer, and the organic insulating layer may include the resin composition.

In an embodiment, the resin composition may include about 10 to about 30% by weight of the polyimide, about 0.03 to about 0.2% by weight of the UV absorber, and the remaining amount of N-methyl-2-pyrrolidone.

In an embodiment, the UV absorber may be formed by reacting a material represented by the following Chemical Formula 2 with a material represented by the following Chemical Formula 3.

[Chemical Formula 2]

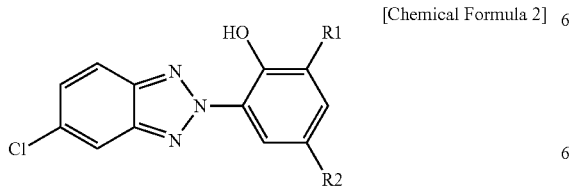

[Chemical Formula 3]

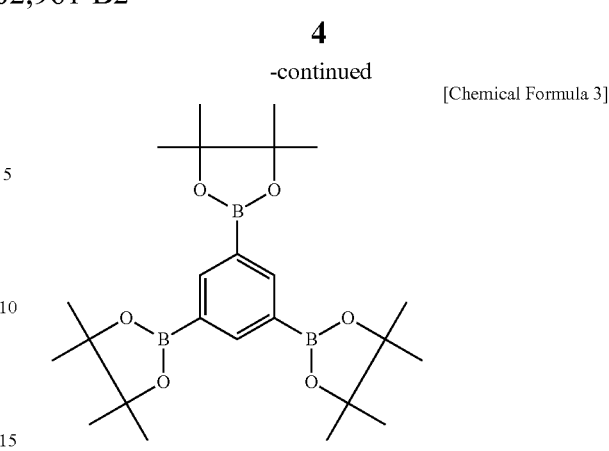

In an embodiment, the material represented by Chemical Formula 2 may be Tinuvin 327, and the R1 and R2 nay be each a tert-butyl group.

In an embodiment, the aliphatic substituent may be selected from an alkyl group and an ether-based substituent.

In an embodiment, the aromatic substituent may be selected from a phenyl group, a pyridinyl group, and a cumenyl group.

A resin composition according to an embodiment may include a polyimide, an ultraviolet (UV) absorber represented by the following Chemical Formula 4 or 5 and a remaining N-methyl-2-pyrrolidone. In Chemical Formula 4 or 5, R1 and R2 may be each selected from a hydrogen group, a halogen group, an aliphatic substituent, and an aromatic group.

[Chemical Formula 4]

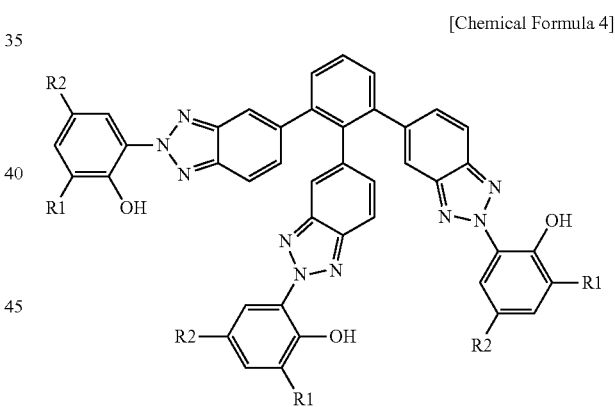

[Chemical Formula 5]

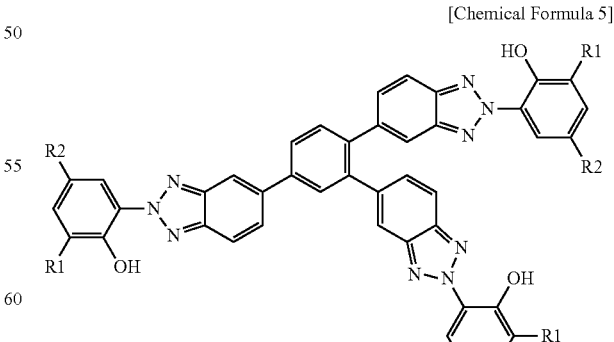

In an embodiment, the resin composition may include about 10 to about 30% by weight of the polyimide, about 0.03 to about 0.2% by weight of the UV absorber, and the remaining amount of N-methyl-2-pyrrolidone.

In an embodiment, the aliphatic substituent may be selected from an alkyl group and an ether-based substituent.

In an embodiment, the aromatic substituent may be a phenyl group, a pyridinyl group, and a cumenyl group.

The display device may include a resin composition including a UV absorber and polyimide. The resin composition may include a UV absorber having a high molecular weight and not having reduced solubility. When the UV absorber emits energy generated after absorbing UV rays, the energy may be emitted non-luminescently. Therefore, the UV absorber may not impair the optical properties of the polymer material located in the vicinity.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, a resin composition and a display device including the resin composition in accordance with embodiments will be explained in detail with reference to the accompanying drawings.

Figure 1:
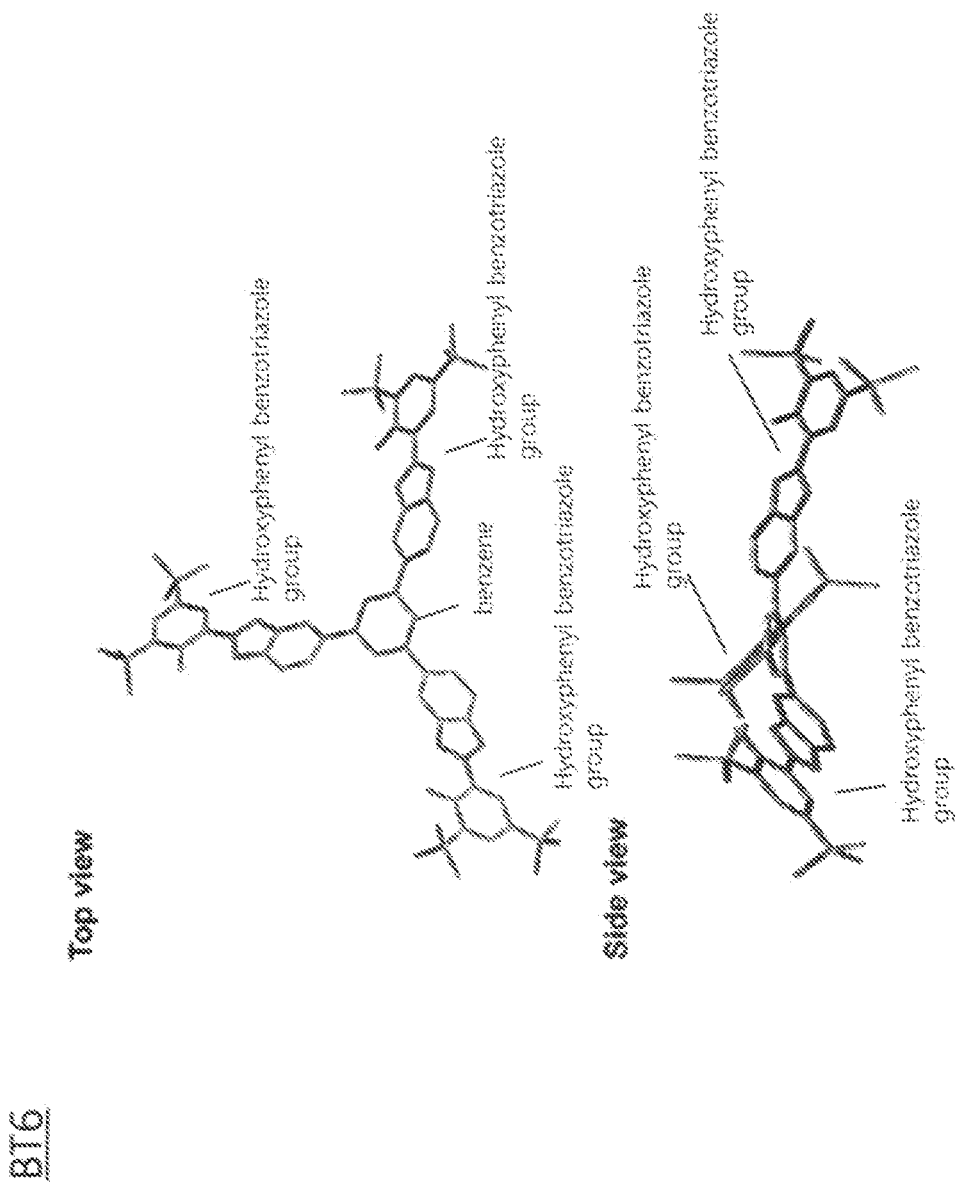
FIG. 1 is a view illustrating a three-dimensional structure of an ultraviolet absorber according to an embodiment.

FIG. 1 is a view illustrating a three-dimensional structure of an ultraviolet absorber according to an embodiment.

Resin Composition

The resin composition may include polyimide, a first ultraviolet (UV) absorber represented by the following Chemical Formula 1, and N-methyl-2-pyrrolidone.

[Chemical Formula 1]

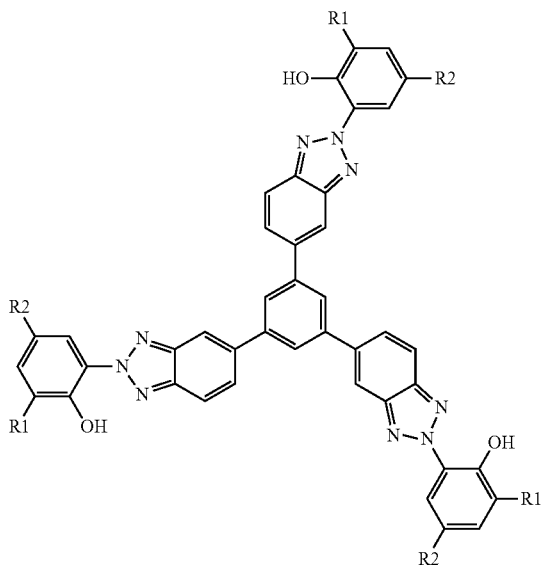

R1 and R2 may each be a hydrogen group, a halogen group, an aliphatic substituent or an aromatic substituent.

In embodiments, the aliphatic substituent may include an alkyl group or an ether-based substituent. For example, the aliphatic substituent may be one of the Chemical Formulas shown below.

Examples of Aliphatic Substituents

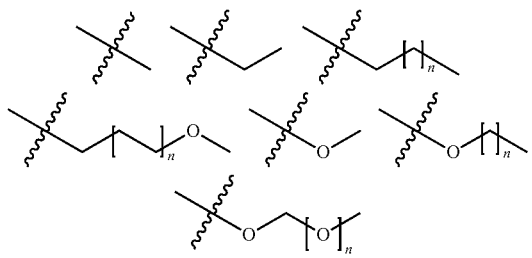

In embodiments, the aromatic substituent may be a phenyl group, a pyridinyl group, or a cumenyl group shown below.

Examples of Aromatic Substituents

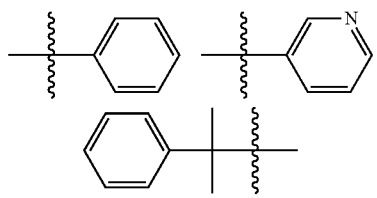

The N-methyl-2-pyrrolidone may serve as a solvent for dissolving the polyimide and the first UV absorber.

The first UV absorber may include a pair of proton donors and proton acceptors. The proton donor may be a hydroxyl group (—OH) positioned adjacent to R1, and the proton acceptor may be one of nitrogens positioned adjacent to the hydroxyl group (—OH).

The first UV absorber may have an excited-state intramolecular proton transfer (ESIPT) characteristic by including a pair of the proton donor and the proton acceptor. Accordingly, when the first ultraviolet absorber emits energy generated after absorbing ultraviolet rays, the energy may be emitted non-luminescently. Therefore, the first UV absorber may not inhibit the optical properties of the polymer material positioned around the first UV absorber. That is, by including the first UV absorber, the resin composition may have excellent durability without impairing the optical properties of the polyimide.

In embodiments, the resin composition may include about 10 to 30% by weight of polyimide, about 0.03 to 0.2% by weight of the first UV absorber, and the remaining amount of N-methyl-2-pyrrolidone.

When the resin composition contains less than about 0.03% by weight of the first UV absorber, UV rays from the outside may not be sufficiently blocked. When the resin composition contains more than about 0.2% by weight of the first UV absorber, transmittance due to the polyimide may be reduced.

In embodiments, the first UV absorber may be obtained by reacting a material represented by the following Chemical Formula 2 with a material represented by the following Chemical Formula 3.

[CHEMICAL FORMULA 2]

[CHEMICAL FORMULA 3]

The material represented by Chemical Formula 2 may be named as a hydroxyphenyl benzotriazole derivative, and the substance represented by Chemical Formula 3 may be named as a 1,3,5-phenyltriboronic acid, tris(pinacol) ester.

A case in which the substituents R1, R2 of the hydroxyphenyl benzotriazole derivative are tert-butyl groups will be described as an example. At this time, the hydroxyphenyl benzotriazole derivative may be named Tinuvin 327.

When Tinuvin 327 and the 1,3,5-phenyltriboronic acid, tris(pinacol) ester react as shown in Scheme 1 below, a material named BT6 (BT6) may be obtained.

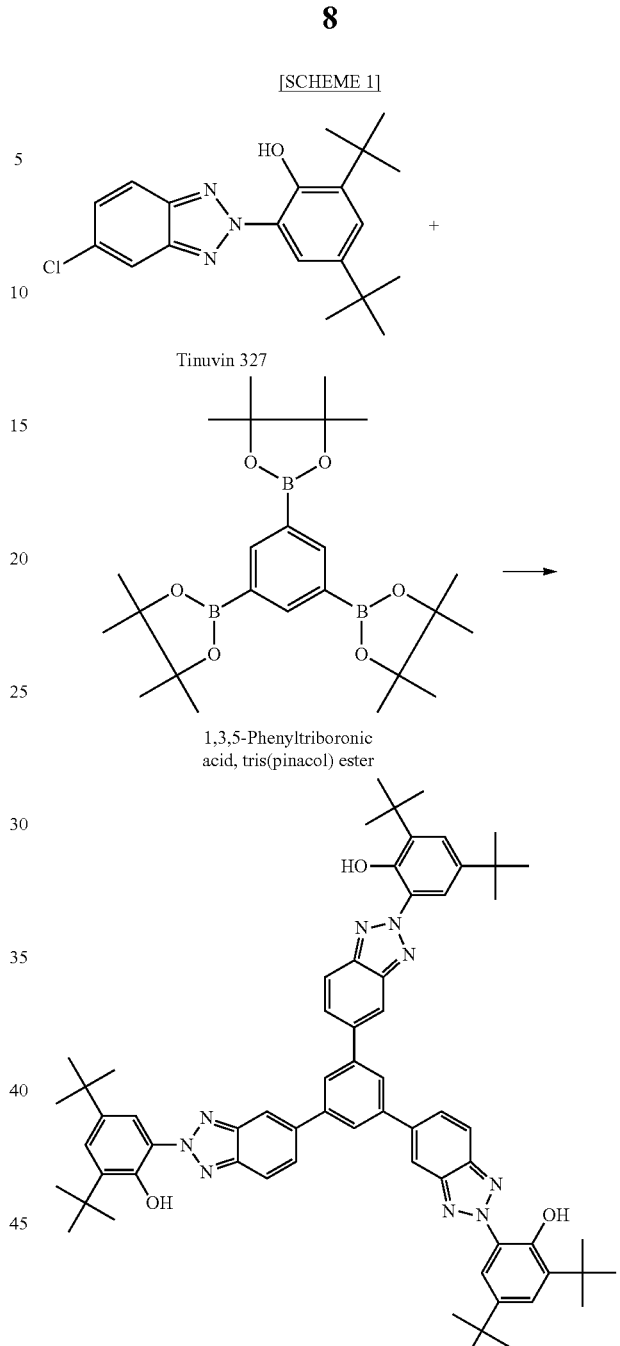

BT6 is a trimeric hydroxyphenyl benzotriazole derivative, in which a plurality of hydroxyphenyl benzotriazole groups are bonded to one benzene. The BT6 is a material in which R1 and R2 in the first ultraviolet absorber are tert-butyl groups, respectively. The trimeric hydroxyphenyl benzotriazole derivative may be strong against heat due to its high molecular weight. That is, the trimeric hydroxyphenyl benzotriazole derivative may have high heat resistance.

Typically, as the molecular weight of a compound increases, heat resistance increases, but solubility decreases. However, the trimeric hydroxyphenyl benzotriazole derivative according to embodiments may have a structure in which a plurality of hydroxyphenyl benzotriazole groups are twisted based on one benzene, as shown in FIG. 1. Accordingly, the trimeric hydroxyphenyl benzotriazole derivative may have relatively increased solubility compared to compounds having a flat structure as the attractive force between the compounds (e.g., van der Waals bond, π-π interaction, etc.) is relatively weakened.

In the above-described embodiments, it is shown that hydroxyphenyl benzotriazole groups are bonded to positions 1, 3, and 5 of one benzene, but this is illustrative and the present invention is not limited thereto. For example, the second UV absorber, as shown in Chemical Formula 4 below, may have a structure in which hydroxyphenyl benzotriazole groups are bonded to positions 1, 2, and 3 of one benzene, respectively.

[CHEMICAL FORMULA 4]

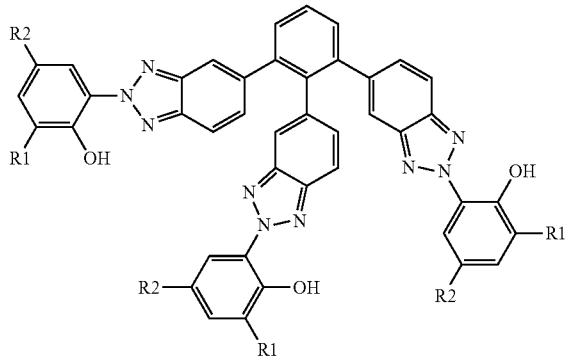

Also, for example, the third UV absorber, as shown in Chemical Formula 5 below, may have a structure in which hydroxyphenyl benzotriazole groups are bonded to positions 1, 2, and 4 of one benzene, respectively.

[CHEMICAL FORMULA 5]

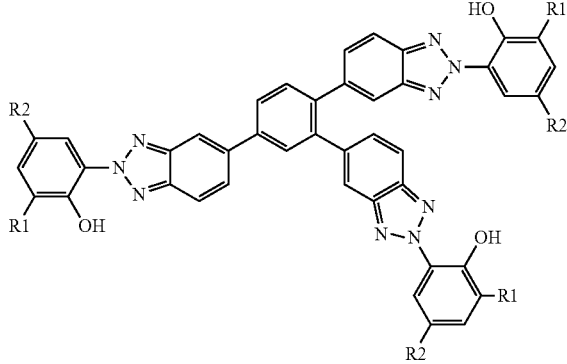

Figure 2:
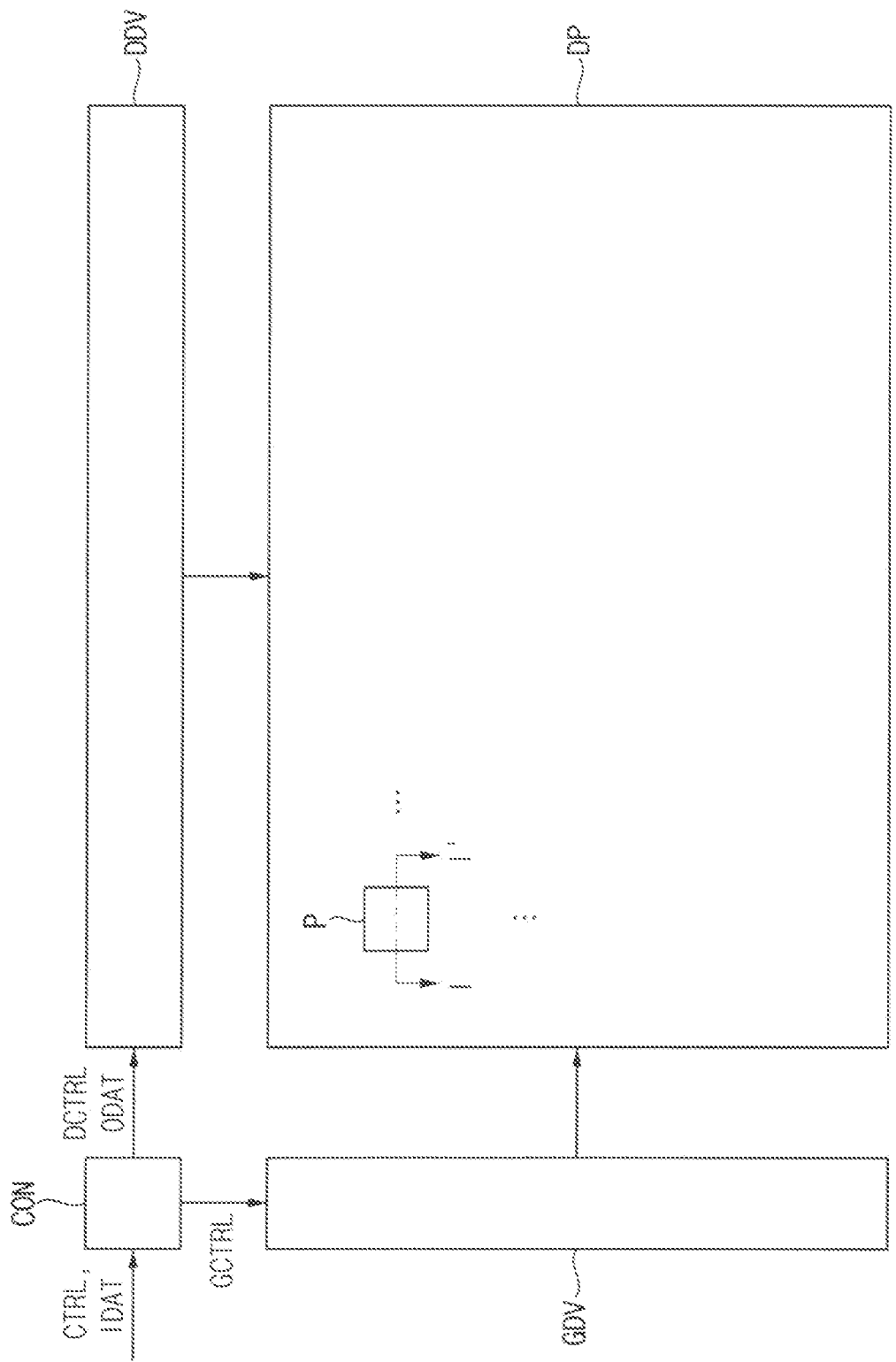
FIG. 2 is a block diagram illustrating a display device according to an embodiment.

FIG. 2 is a block diagram illustrating a display device according to an embodiment.

Referring to FIG. 2, the display device may include a display panel DP including a plurality of pixels P, a data driver DDV, a gate driver GDV, and a timing controller CON.

The display device may display an image through the display panel DP. To this end, the display panel DP may include a plurality of pixels and light emitting elements connected to the pixels. In embodiments, the display panel DP may be configured as a single panel. Alternatively, in embodiments, the display panel DP may include a plurality of panels.

The timing controller CON may generate a gate control signal GCTRL, a data control signal DCTRL, and an output image data ODAT based on a control signal CTRL and an input image data IDAT provided from the outside. For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, and the like. In embodiments, the gate driver GDV may be manufactured as a separate panel and connected to the display panel DP. The gate driver GDV is electrically connected to the display panel DP and may sequentially output the gate signals. Each of the pixels may receive a data voltage according to the control of each of the gate signals.

The data driver DDV may generate the data voltage based on the data control signal DCTRL and the output image data ODAT provided from the timing controller CON. For example, the data control signal DCTRL may include an output data enable signal, a horizontal start signal, and a load signal. In embodiments, the data driver DDV may be manufactured as a separate panel and electrically connected to the display panel DP. The data driver DDV is electrically connected to the display panel DP and may generate a plurality of data voltages. Each of the pixels may transmit a signal for luminance corresponding to each of the data voltages to the light emitting elements.

Figure 3:
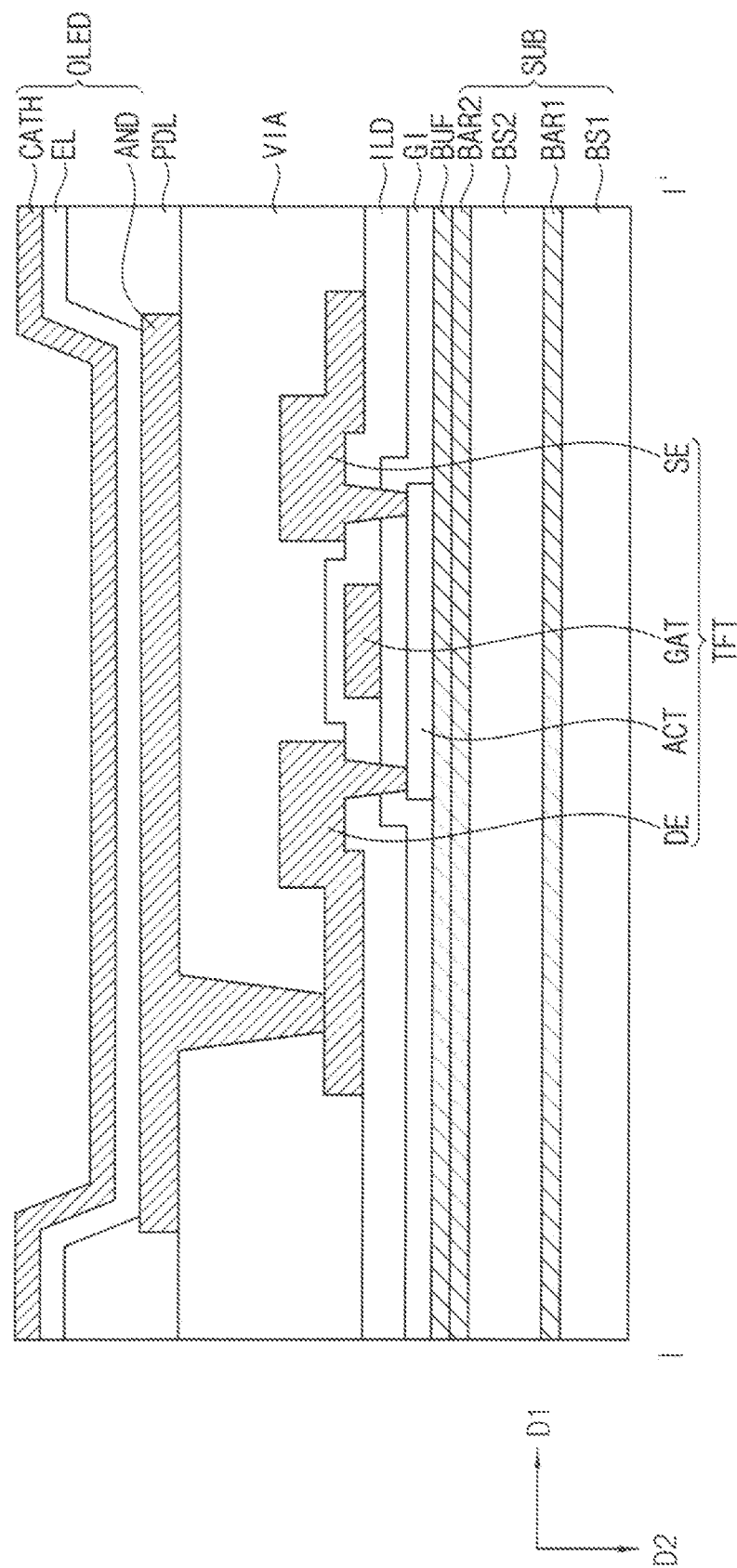
FIG. 3 is a cross-sectional view illustrating an embodiment of a cross-section taken along the line I-I' of FIG. 2.

FIG. 3 is a cross-sectional view illustrating an embodiment of a cross-section taken along the line I-I' of FIG. 2.

Referring to FIGS. 2 and 3, the display device may include a substrate SUB, a buffer layer BUF, a gate insulating layer GI, an interlayer insulating layer ILD, a via insulating layer VIA, a transistor TFT, a pixel defining layer PDL, and an organic light emitting diode OLED.

The transistor TFT may include an active layer ACT, a gate electrode GAT, a source electrode SE, and a drain electrode DE. The organic light emitting diode OLED may include an anode electrode AND, a light emitting layer EL, and a cathode electrode CATH.

The substrate SUB may include a plurality of layers. For example, the substrate SUB may have a structure in which a first base substrate BS1, a first barrier layer BAR1, a second base substrate BS2, and a second barrier layer BAR2 are stacked.

In embodiments, the first base substrate BS1 may have rigid characteristics. In this case, the first base substrate BS1 may include glass, quartz, or the like. In addition, in embodiments, the first base substrate BS1 may have a flexible characteristic. In this case, the first base substrate BS1 may include plastic or the like. For example, the first base substrate BS1 may include polyimide.

The first barrier layer BAR1 may be disposed on the first base substrate SUB1. The first barrier layer BAR1 may include an organic material or an inorganic material. In an embodiment, the first barrier layer BAR1 may include silicon oxide ("SiOx"), silicon nitride ("SiNx"), silicon oxynitride ("SiOxNy"), or the like. The first barrier layer BAR1 may prevent diffusion of impurities from the first base substrate SUB1 to the transistor TFT. In addition, the first barrier layer BAR1 may protect the transistor TFT from external impact.

The second base substrate BS2 may be disposed on the first barrier layer BAR1. The second base substrate BS2 may include substantially the same material as the first base substrate BS1.

In embodiments, at least one of the first base substrate BS1 and the second base substrate BS2 may include the resin composition. That is, at least one of the first base substrate BS1 and the second base substrate BS2 may be formed using a resin composition including the polyimide, the ultraviolet absorber, and the N-methyl-2-pyrrolidone.

The buffer layer BUF may be disposed on the second barrier layer BAR2. For example, the buffer layer BUF may include silicon oxide ("SiOx"), silicon nitride ("SiNx"), silicon oxynitride ("SiOxNy"), or the like. The buffer layer BUF may prevent metal atoms or impurities from diffusing into the active layer ACT. In addition, the buffer layer BUF may control the speed of heat provided to the active layer ACT during a crystallization process for forming the active layer ACT.

The active layer ACT may be disposed on the buffer layer BUF. In embodiments, the active layer ACT may include a silicon semiconductor. For example, the active layer ACT may include amorphous silicon, polycrystalline silicon, or the like. Alternatively, in embodiments, the active layer ACT may include an oxide semiconductor. For example, the active layer ACT may include indium-gallium-zinc oxide ("IGZO"), indium-gallium oxide ("IGO"), and indium-zinc oxide ("IZO").

The gate insulating layer GI may be disposed on the buffer layer BUF. The gate insulating layer GI may be disposed to cover the active layer ACT. The gate insulating layer GI may include an insulating material. For example, the gate insulating layer GI may include silicon oxide ("SiOx"), silicon nitride ("SiNx"), silicon oxynitride ("SiOxNy"), or the like.

The gate electrode GAT may be disposed on the gate insulating layer GI. The gate electrode GAT may overlap the active layer ACT. In response to a gate signal provided to the gate electrode GAT, a signal or a voltage may flow through the active layer ACT. In an embodiment, the gate electrode GAT may include a metal, an alloy, a metal oxide, a transparent conductive material, or the like. For example, the gate electrode GAT may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt") , Scandium ("Sc"), indium tin oxide ("ITO"), indium zinc oxide ("IZO"), and the like.

The interlayer insulating layer ILD may be disposed on the gate insulating layer GI. The interlayer insulating layer ILD may be disposed to cover the gate electrode GAT. In an embodiment, the interlayer insulating layer ILD may include an insulating material. For example, the interlayer insulating layer ILD may include silicon oxide ("SiOx"), silicon nitride ("SiNx"), silicon oxynitride ("SiOxNy"), or the like.

The source electrode SE and the drain electrode DE may be disposed on the interlayer insulating layer ILD. The source electrode SE and the drain electrode DE may contact the active layer ACT. In an embodiment, the source electrode SE and the drain electrode DE may include a metal, an alloy, a metal oxide, a transparent conductive material, and the like. For example, the source electrode SE and the drain electrode DE may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt") , Scandium ("Sc"), indium tin oxide ("ITO"), indium zinc oxide ("IZO"), and the like.

The via insulating layer VIA may be disposed on the interlayer insulating layer ILD. The via insulating layer VIA may be disposed to cover the source electrode SE and the drain electrode DE. In an embodiment, the via insulating layer VIA may include an organic insulating material. Accordingly, the via insulating layer VIA may have a substantially flat top surface. For example, the via insulating layer VIA may include a photoresist, a polyacrylic resin, a polyimide resin, an acrylic resin, or the like.

In embodiments, the via insulating layer VIA may include the resin composition. That is, the via insulating layer VIA may be formed using a resin composition including the polyimide, the ultraviolet absorber, and the N-methyl-2-pyrrolidone.

The anode electrode AND may be disposed on the via insulating layer VIA. The anode electrode AND may contact the drain electrode DE. In an embodiment, the anode electrode AND may include a metal, an alloy, a metal oxide, a transparent conductive material, or the like. For example, the anode electrode AND may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt") , Scandium ("Sc"), indium tin oxide ("ITO"), indium zinc oxide ("IZO"), and the like.

The pixel defining layer PDL may be disposed on the via insulating layer VIA. An opening exposing the anode electrode AND may be formed in the pixel defining layer PDL. In an embodiment, the pixel defining layer PDL may include an organic material. For example, the pixel defining layer PDL may include a photoresist, a polyacrylic resin, a polyimide resin, an acrylic resin, or the like.

The light emitting layer EL may be disposed on the anode electrode AND. The light emitting layer EL may include an organic material emitting light of a predetermined color. The light emitting layer EL may emit the light based on a potential difference between the anode electrode AND and the cathode electrode CATH.

In addition, the light emitting layer EL may include at least one of a hole injection layer HIL, a hole transport layer HTL, an electron transport layer ETL, and an electron injection layer EIL.

The cathode electrode CATH may be disposed on the light emitting layer EL. The cathode electrode CATH may include a metal, an alloy, a metal oxide, a transparent conductive material, or the like. For example, the cathode electrode CATH may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt") , Scandium ("Sc"), indium tin oxide ("ITO"), indium zinc oxide ("IZO"), and the like.

Figure 4:
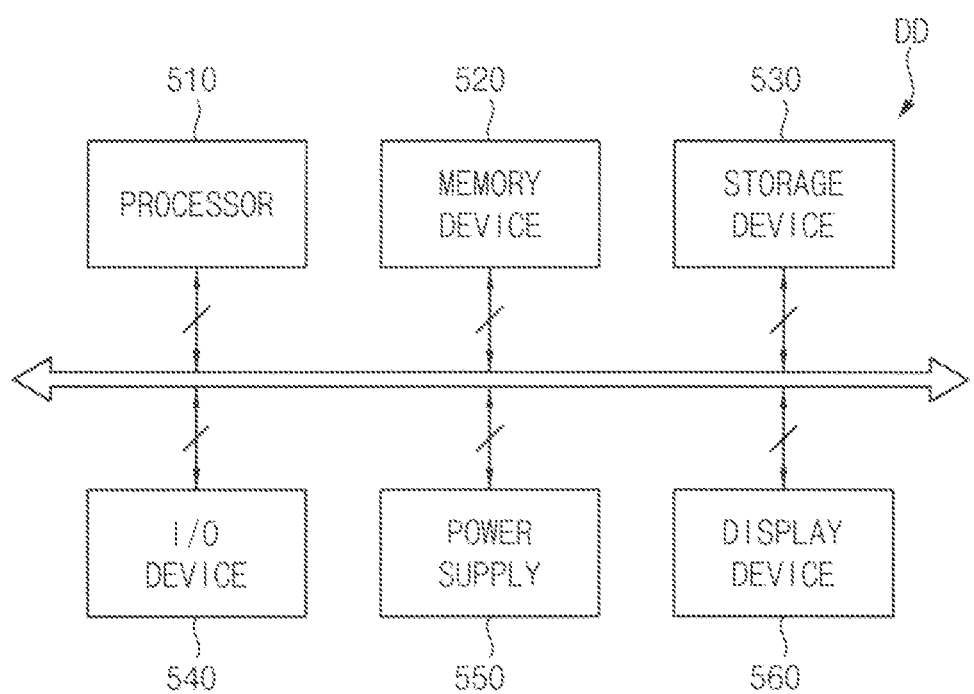
FIG. 4 is a block diagram illustrating an electronic device according to an embodiment.
Figure 5:
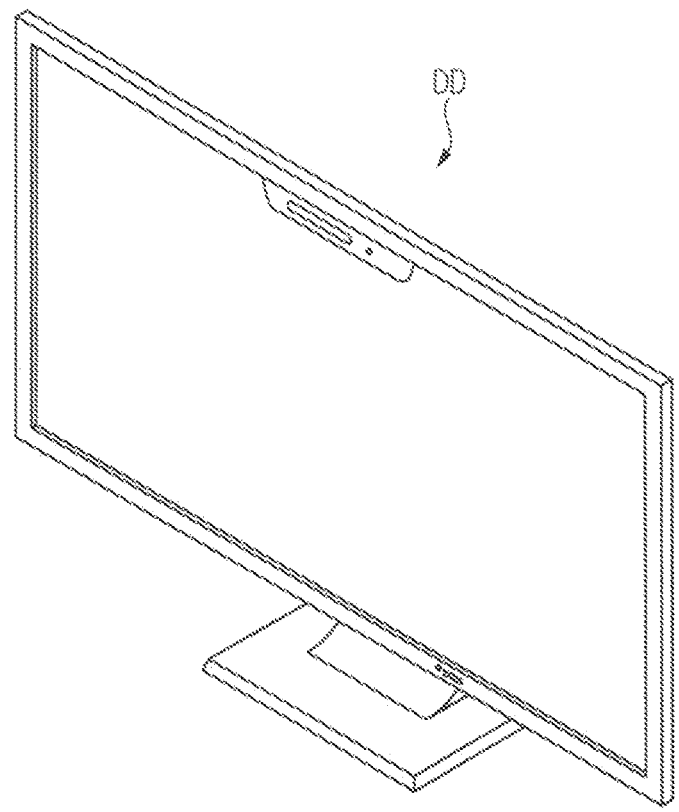
FIG. 5 is a diagram illustrating an embodiment in which the electronic device of FIG. 4 is implemented as a television.
Figure 6:
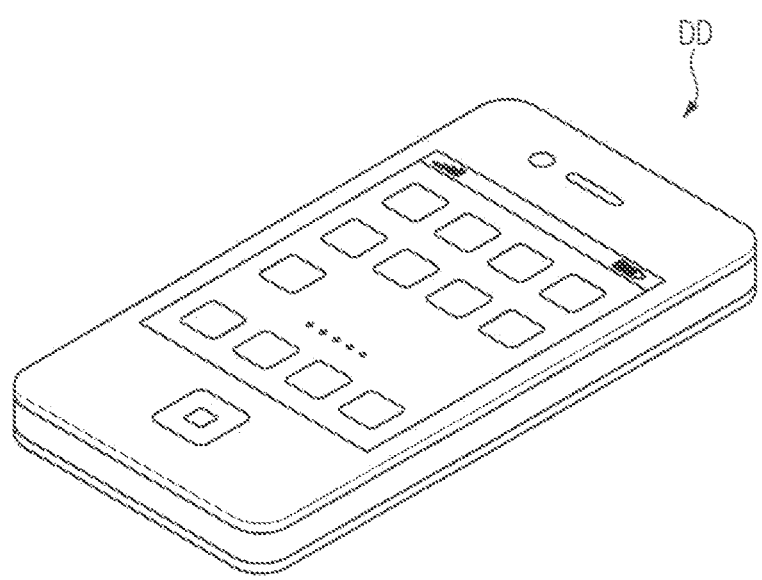
FIG. 6 is a diagram illustrating an embodiment in which the electronic device of FIG. 4 is implemented as a smart phone.

FIG. 4 is a block diagram illustrating an electronic device according to an embodiment, FIG. 5 is a diagram illustrating an embodiment in which the electronic device of FIG. 4 is implemented as a television, and FIG. 6 is a diagram illustrating an embodiment in which the electronic device of FIG. 4 is implemented as a smart phone.

Referring to FIGS. 4 to 6, an electronic device DD may include a processor 510, a memory device 520, a storage device 530, an input/output device 540, a power supply 550, and a display device 560. In this case, the display device 560 may correspond to the display device described with reference to the aforementioned drawings. The electronic device DD may further include several ports capable of communicating with a video card, a sound card, a memory card, a USB device, and the like. In an embodiment, as illustrated in FIG. 5, the electronic device DD may be implemented as a television. In another embodiment, as illustrated in FIG. 6, the electronic device DD may be implemented as a smartphone. However, the electronic device DD is not limited thereto, and for example, the electronic device DD includes a mobile phone, a video phone, a smart pad, a smart watch, a tablet PC, a vehicle navigation system, It may be implemented as a computer monitor, notebook computer, head mounted display (HMD), or the like.

The processor 510 may perform specific calculations or tasks. In an embodiment, the processor 510 may be a micro processor, a central processing unit (CPU), an application processor (AP), or the like. The processor 510 may be connected to other components through an address bus, a control bus, a data bus, or the like. In an embodiment, the processor 510 may also be connected to an expansion bus such as a peripheral component interconnect (PCI) bus.

The memory device 520 may store data necessary for the operation of the electronic device DD. For example, the memory device 520 may include nonvolatile memory device such as an erasable programmable read-only memory (EPROM) device, an electrically erasable programmable read-only memory (EEPROM) device, a flash memory device, and a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or volatile memory device such as a dynamic random access memory (DRAM) device, a static random access memory (SRAM) device, a mobile DRAM device.

The storage device 530 may include a solid state drive (SSD), a hard disk drive (HDD), a CD-ROM, or the like. The input/output device 540 may include an input means such as a keyboard, a keypad, a touch pad, a touch screen, and a mouse, and an output means such as a speaker and a printer.

The resin composition and the display device including the resin composition according to the embodiments may be applied to a display device included in a computer, a notebook, a mobile phone, a smart phone, a smart pad, a PMP, a PDA, an MP3 player, or the like.

Although the resin composition and the display device including the resin composition according to the embodiments have been described with reference to the drawings, the illustrated embodiments are examples, and may be modified and changed by a person having ordinary skill in the art without departing from the scope and spirit of the following claims.

What is claimed is:
1. A resin composition, comprising:
a polyimide;
an ultraviolet (UV) absorber represented by the following Chemical Formula 1; and
N-methyl-2-pyrrolidone,

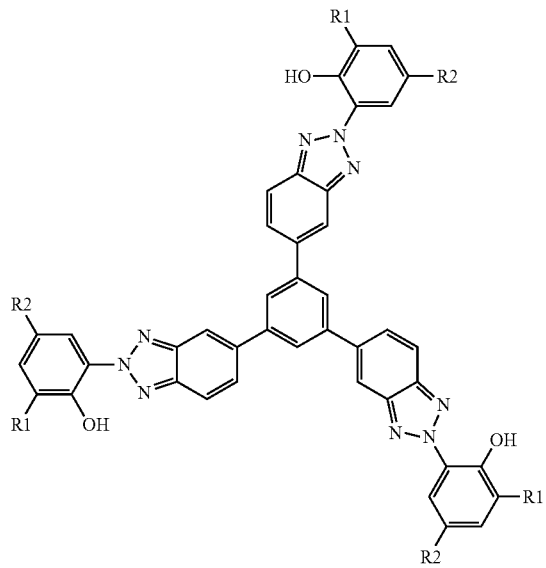

[Chemical Formula 1]

wherein, in Chemical Formula 1, R1 and R2 are each selected from a hydrogen group, a halogen group, an aliphatic substituent, or an aromatic group.

2. The resin composition of claim 1, wherein the resin composition includes about 10 to about 30% by weight of the polyimide, about 0.03 to about 0.2% by weight of the UV absorber, and the remaining amount of N-methyl-2-pyrrolidone.

3. The resin composition of claim 1, wherein the UV absorber is formed by reacting a material represented by the following Chemical Formula 2 with a material represented by the following Chemical Formula 3,

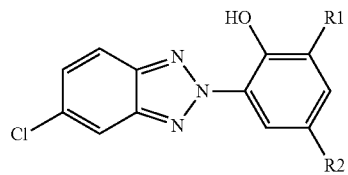

[Chemical Formula 2]

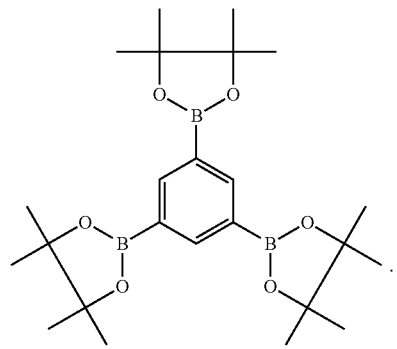

[Chemical Formula 3]

4. The resin composition of claim 3, wherein the material represented by Chemical Formula 2 is hydroxyphenyl benzotriazole derivative, and the R1 and R2 are each a tert-butyl group.

5. The resin composition of claim 1, wherein the aliphatic substituent is selected from an alkyl group, or an ether-based substituent.

6. The resin composition of claim 1, wherein the aromatic substituent is selected from a phenyl group, a pyridinyl group, or a cumenyl group.

7. A display device, comprising:
a transistor substrate including a base substrate and at least one transistor disposed on the base substrate; and
a light emitting element disposed on the transistor substrate and electrically connected to the transistor substrate,
wherein the base substrate includes a resin composition which includes:
a polyimide;
an ultraviolet (UV) absorber represented by the following Chemical Formula 1; and
N-methyl-2-pyrrolidone,

[Chemical Formula 1]

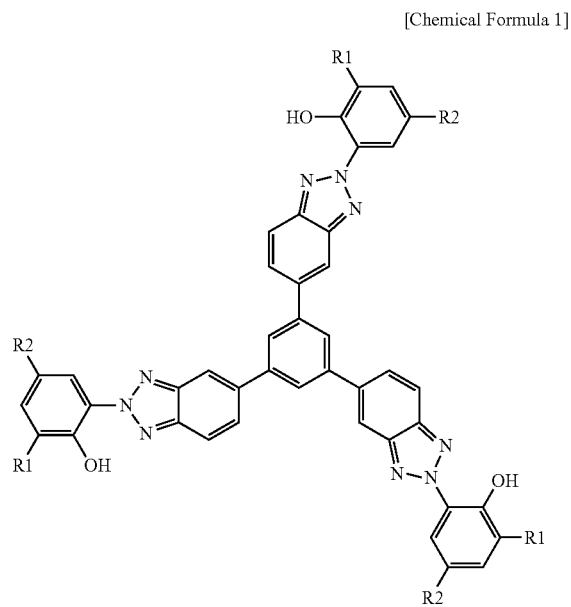

wherein, in Chemical Formula 1, R1 and R2 are each selected from a hydrogen group, a halogen group, an aliphatic substituent, or an aromatic group.

8. The display device of claim 7, further comprising:
a pixel defining layer disposed on the transistor substrate, having an opening exposing the transistor substrate and including the resin composition,
wherein the light emitting element includes:
a first electrode disposed in the opening;
a light emitting layer disposed on the first electrode; and
a second electrode disposed on the light emitting layer.

9. The display device of claim 7, wherein the transistor substrate includes at least one organic insulating layer, and the organic insulating layer includes the resin composition.

10. The display device of claim 7, wherein the resin composition includes about 10 to about 30% by weight of the polyimide, about 0.03 to about 0.2% by weight of the UV absorber, and the remaining amount of N-methyl-2-pyrrolidone.

11. The display device of claim 7, wherein the UV absorber is formed by reacting a material represented by the following Chemical Formula 2 with a material represented by the following Chemical Formula 3,

[Chemical Formula 2]

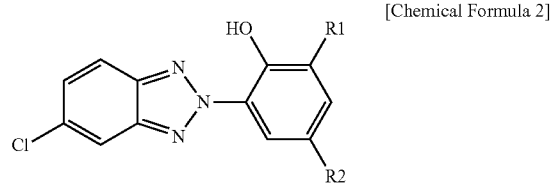

[Chemical Formula 3]

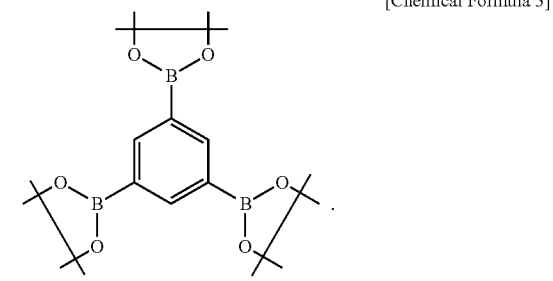

12. The display device of claim 7, wherein the material represented by Chemical Formula 2 is hydroxyphenyl benzotriazole derivative, and the R1 and R2 are each a tert-butyl group.

13. The resin composition of claim 7, wherein the aliphatic substituent is selected from an alkyl group, or an ether-based substituent.

14. The resin composition of claim 7, wherein the aromatic substituent is selected from a phenyl group, a pyridinyl group, or a cumenyl group.

15. A resin composition, comprising:
a polyimide;
an ultraviolet (UV) absorber represented by the following Chemical Formula 4 or 5; and
N-methyl-2-pyrrolidone,

[Chemical Formula 4]

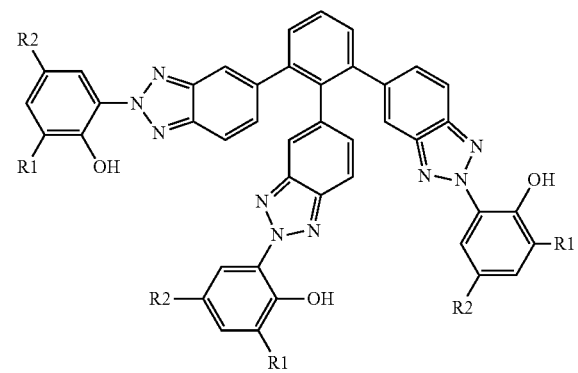

-continued

[Chemical Formula 5]

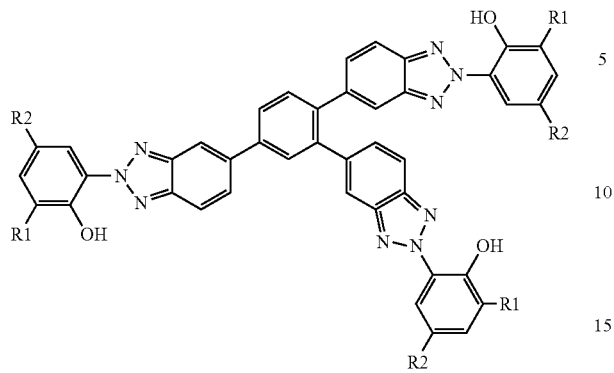

wherein, in Chemical Formula 4 or 5, R1 and R2 are each selected from a hydrogen group, a halogen group, an aliphatic substituent, or an aromatic group.

16. The resin composition of claim 15, wherein the resin composition includes about 10 to about 30% by weight of the polyimide, about 0.03 to about 0.2% by weight of the UV absorber, and the remaining amount of N-methyl-2-pyrrolidone.

17. The resin composition of claim 15, wherein the aliphatic substituent is selected from an alkyl group, or an ether-based substituent.

18. The resin composition of claim 15, wherein the aromatic substituent is selected from a phenyl group, a pyridinyl group, or a cumenyl group.

* * * * *